United States Patent
Sato et al.

(10) Patent No.: US 10,943,643 B2
(45) Date of Patent: Mar. 9, 2021

(54) SEMICONDUCTOR STORAGE CIRCUIT

(71) Applicant: SOCIONEXT INC., Kanagawa (JP)

(72) Inventors: Masataka Sato, Yokohama (JP); Hideo Akiyoshi, Yokohama (JP); Masanobu Hirose, Yokohama (JP); Yoshinobu Yamagami, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/847,551

(22) Filed: Apr. 13, 2020

(65) Prior Publication Data
US 2020/0243128 A1 Jul. 30, 2020

Related U.S. Application Data

(63) Continuation of application No. PCT/JP2017/038036, filed on Oct. 20, 2017.

(51) Int. Cl.
G11C 11/408 (2006.01)
G11C 5/02 (2006.01)
G11C 11/4099 (2006.01)

(52) U.S. Cl.
CPC .......... *G11C 11/4087* (2013.01); *G11C 5/025* (2013.01); *G11C 11/4082* (2013.01); *G11C 11/4085* (2013.01); *G11C 11/4099* (2013.01)

(58) Field of Classification Search
CPC ................................................ G11C 11/4087
See application file for complete search history.

(56) References Cited

U.S. PATENT DOCUMENTS

| | | | |
|---|---|---|---|
| 5,894,448 A | 4/1999 | Amano et al. | |
| 6,128,208 A | 10/2000 | Itoh et al. | |
| 2002/0117722 A1 | 8/2002 | Osada et al. | |
| 2006/0126417 A1* | 6/2006 | Akiyoshi | G11C 7/1048 365/230.03 |
| 2006/0164881 A1* | 7/2006 | Oki | H01L 27/0207 365/154 |
| 2007/0002617 A1* | 1/2007 | Houston | H01L 27/1104 365/185.07 |

(Continued)

FOREIGN PATENT DOCUMENTS

| | | |
|---|---|---|
| JP | H06-89584 A | 3/1994 |
| JP | H10-269765 A | 10/1998 |

(Continued)

OTHER PUBLICATIONS

International Search Report and Written Opinion issued in corresponding International Patent Application No. PCT/JP2017/038036, dated. Jan. 16, 2018, with partial translation.

*Primary Examiner* — Douglas King
(74) *Attorney, Agent, or Firm* — McDermott Will & Emery LLP

(57) ABSTRACT

First and second memory cell arrays each having memory cells arranged in the X and Y directions lie side by side in the Y direction with space between them. A relay buffer is provided between first and second row decoders for buffering a control signal to be supplied to the second row decoder. An inter-array block between the first and second memory cell arrays is constituted by at least either a tap cell or a dummy memory cell. The relay buffer and the inter-array block are the same in position and size in the Y direction.

10 Claims, 10 Drawing Sheets

(56) References Cited

U.S. PATENT DOCUMENTS

| | | |
|---|---|---|
| 2011/0063928 A1 | 3/2011 | Kanehara et al. |
| 2013/0154027 A1* | 6/2013 | Liaw .................... G11C 11/412 |
| | | 257/390 |
| 2013/0329487 A1 | 12/2013 | Asayama |

FOREIGN PATENT DOCUMENTS

| | | |
|---|---|---|
| JP | 2001-28401 A | 1/2001 |
| JP | 2001-68635 A | 3/2001 |
| JP | 2006-172541 A | 6/2006 |
| JP | 2013-258165 A | 12/2013 |
| WO | 2010/150432 A1 | 12/2010 |

* cited by examiner

FIG.5
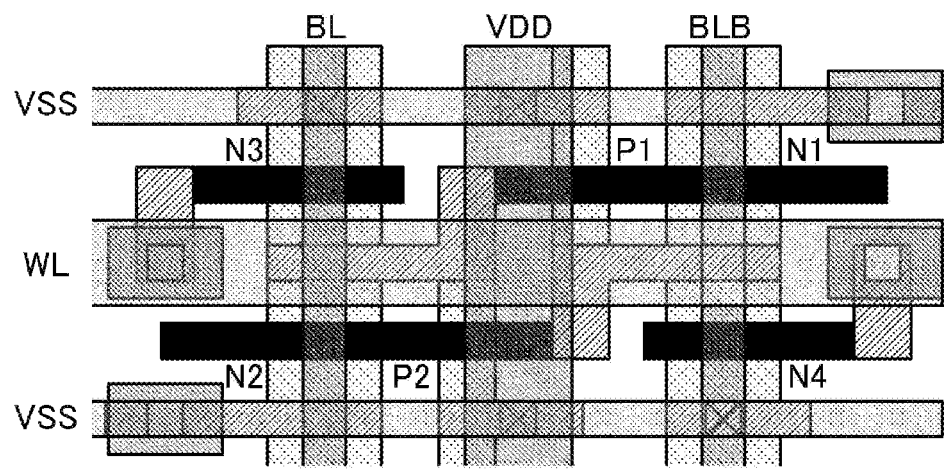
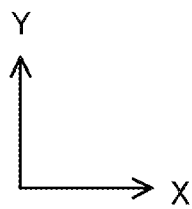

51a,51b

SEMICONDUCTOR STORAGE CIRCUIT

CROSS-REFERENCE TO RELATED APPLICATIONS

This is a continuation of International Application No. PCT/JP2017/038036 filed on Oct. 20, 2017. The entire disclosure of this application is incorporated by reference herein.

BACKGROUND

The present disclosure relates to a semiconductor storage circuit, and more particularly to a layout structure thereof.

A semiconductor storage circuit such as a static random access memory (SRAM) occupies a large region of a recent semiconductor integrated circuit. For this reason, it is important to prevent or reduce an increase in the area of a semiconductor storage circuit while keeping its performance high. Also, with the progress of fine patterning, the interconnect resistance increases, causing an increase in interconnect delay. This raises a problem of degradation in performance due to an interconnect delay.

Japanese Unexamined Patent Publication No. H06-89584 (Patent Document 1) discloses a configuration of an SRAM in which addresses output from an address buffer are transmitted to gates provided in a row decoder. Japanese Unexamined Patent Publication No. H10-269765 (Patent Document 2) discloses a configuration of an SRAM in which a buffer circuit is inserted for transmission of various control signals supplied to the memory.

SUMMARY

The configuration of Patent Document 1 has a problem that, as the number of rows of the memory increases, the interconnect delay increases due to the resistance of interconnects through which addresses are transmitted, causing degradation in the performance of the memory. In the configuration of Patent Document 2, while the problem of the interconnect delay is solved by the insertion of the buffer, no detailed examination has been made on an increase in area due to the buffer insertion.

An objective of the present disclosure is providing a semiconductor storage circuit in which an increase in area is prevented or reduced while degradation in performance due to an increase in interconnect delay caused by interconnect resistance is prevented or reduced.

In the first mode of the present disclosure, the semiconductor storage circuit includes: a first memory cell array having a plurality of memory cells arranged in X and Y directions; a second memory cell array having a plurality of memory cells arranged in the X and Y directions and lying side by side with the first memory cell array in the Y direction with space between them; a first row decoder including a plurality of word line drivers corresponding to rows of the first memory cell array; a second row decoder including a plurality of word line drivers corresponding to rows of the second memory cell array and lying side by side with the first row decoder in the Y direction with space between them; a control circuit configured to generate a control signal to be supplied to the first and second row decoders: a relay buffer, provided between the first row decoder and the second row decoder, configured to buffer the control signal to be supplied to the second row decoder; and an inter-array block provided between the first memory cell array and the second memory cell array and constituted by at least either a tap cell or a dummy memory cell, wherein the relay buffer and the inter-array block are the same in position and size in the Y direction.

According to the above mode, the relay buffer that buffers the control signal to be supplied to the second row decoder is provided between the first row decoder and the second row decoder. With this relay buffer, interconnect delay related to the control signal supplied to the second row decoder is prevented or reduced. Also, the inter-array block lying between the first memory cell array and the second memory cell array is constituted by at least either a tap cell or a dummy memory cell, and the relay buffer and the inter-array block are the same in position and size in the Y direction. No wasted dead space therefore occurs between the relay buffer and the first and second row decoders. Thus, in the semiconductor storage circuit, it is possible to prevent or reduce an increase in area while preventing or reducing degradation in performance due to an increase in interconnect delay caused by interconnect resistance.

In the first mode of the present disclosure, the semiconductor storage circuit comprises: a first memory cell array having a plurality of memory cells arranged in X and Y directions; a second memory cell array having a plurality of memory cells arranged in the X and Y directions and lying side by side with the first memory cell array in the Y direction with space between them; a first row decoder including a plurality of word line drivers corresponding to rows of the first memory cell array; a second row decoder including a plurality of word line drivers corresponding to rows of the second memory cell array and lying side by side with the first row decoder in the Y direction with space between them; a control circuit configured to generate a control signal to be supplied to the first and second row decoders: a relay buffer, provided between the first row decoder and the second row decoder, configured to buffer the control signal to be supplied to the second row decoder; and an inter-array block provided between the first memory cell array and the second memory cell array and constituted by at least either a tap cell or a dummy memory cell, wherein a region between the first row decoder and the second row decoder is the same as the inter-array block in position and size in the Y direction.

According to the above mode, the relay buffer that buffers the control signal to be supplied to the second row decoder is provided between the first row decoder and the second row decoder. With this relay buffer, interconnect delay related to the control signal supplied to the second row decoder is prevented or reduced. Also, the inter-array block lying between the first memory cell array and the second memory cell array is constituted by at least either a tap cell or a dummy memory cell, and the region between the first row decoder and the second row decoder is the same with the inter-array block in position and size in the Y direction. No wasted dead space therefore occurs between the relay buffer and the first and second row decoders. Thus, in the semiconductor storage circuit, it is possible to prevent or reduce an increase in area while preventing or reducing degradation in performance due to an increase in interconnect delay caused by interconnect resistance.

According to the present disclosure, in a semiconductor storage circuit, it is possible prevent or reduce an increase in area while preventing or reducing degradation in performance due to an increase in interconnect delay caused by interconnect resistance.

BRIEF DESCRIPTION OF THE DRAWINGS

FIG. 5 is a layout of a memory cell.

DETAILED DESCRIPTION

An embodiment of the present disclosure will be described hereinafter with reference to the accompanying drawings.

Figure 1:
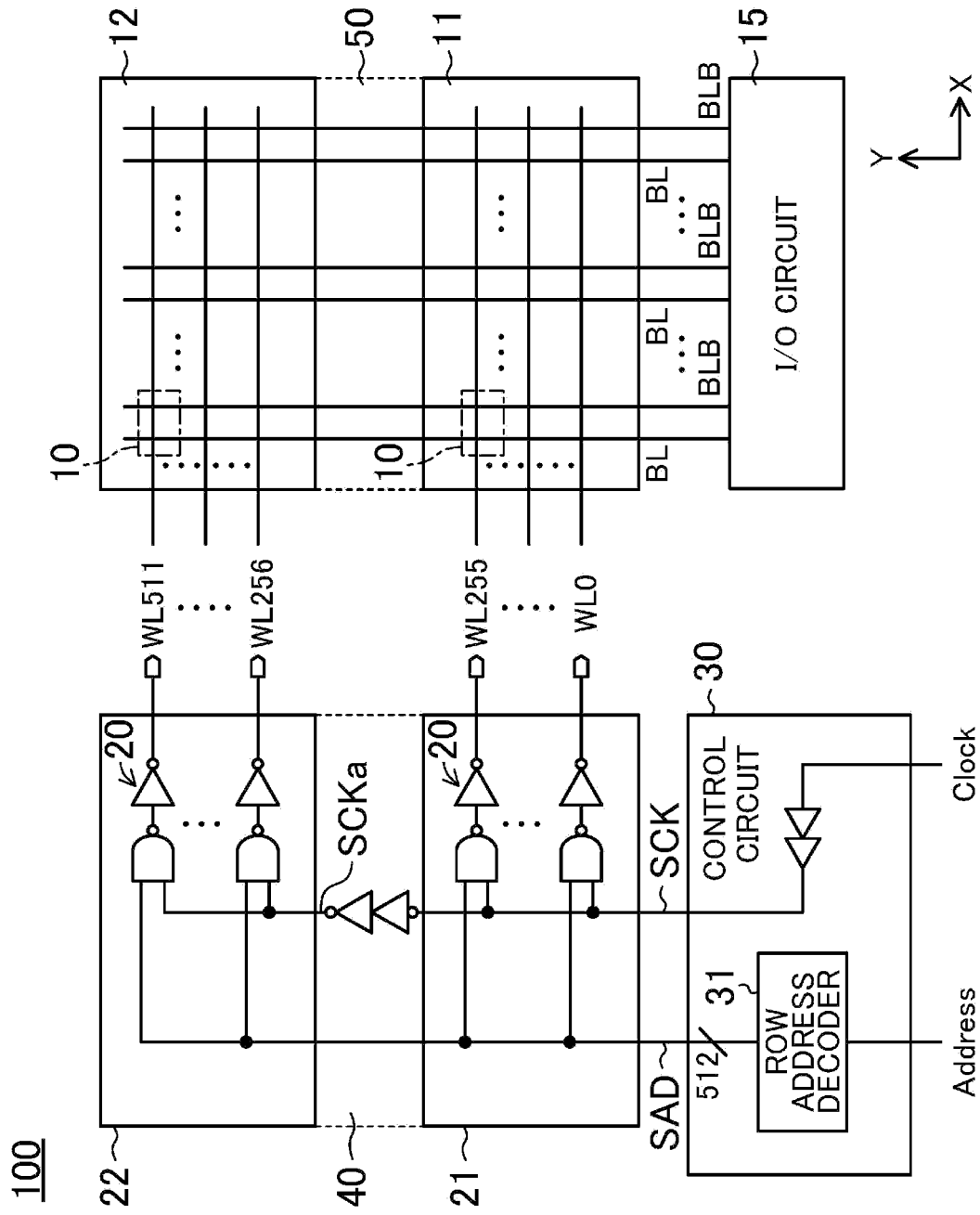
FIG. 1 is a conceptual diagram of the entire layout of a semiconductor storage circuit of an embodiment.

FIG. 1 is a conceptual diagram showing the entire layout of a semiconductor storage circuit of an embodiment. A semiconductor storage circuit 100 of FIG. 1 includes first and second memory cell arrays 11 and 12 each having a plurality of memory cells 10 arranged in the X and Y directions. The first memory cell array 11 and the second memory cell array 12 are placed side by side in the Y direction with space between them. In this embodiment, the first and second memory cell arrays 11 and 12 each have 256 rows. As a whole, the semiconductor storage circuit 100 has a memory of 512 rows. Word lines WL* (* is 0 to 511) extending in the X direction and bit line pairs BL/BLB extending in the Y direction are provided in the first and second memory cell arrays 11 and 12: each memory cell 10 is connected with any one of the word lines WL* and any one of the bit line pairs BL/BLB. An inter-array block 50 is provided between the first memory cell array 11 and the second memory cell array 12.

Figure 2:
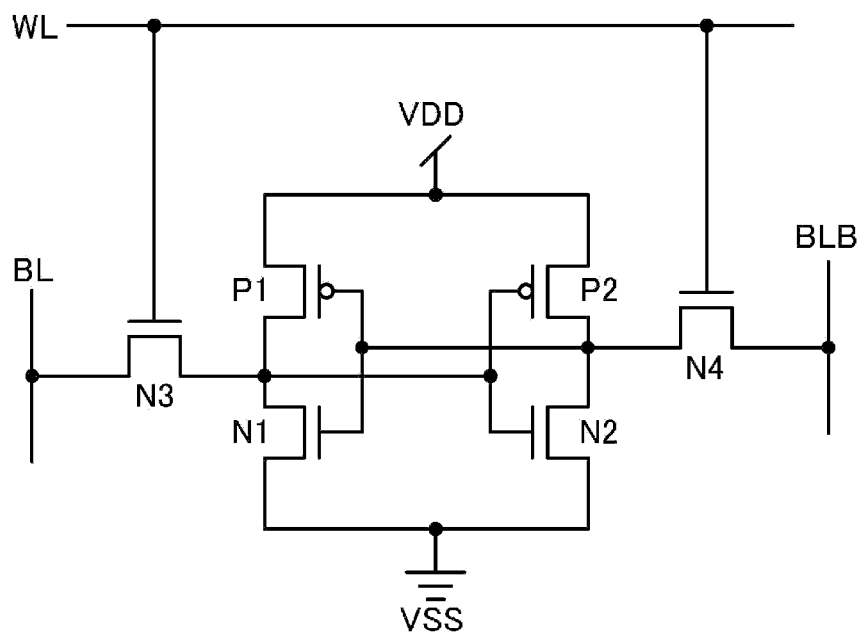
FIG. 2 is a circuit configuration diagram of a memory cell.

FIG. 2 is a view showing a circuit configuration of the memory cell 10. As shown in FIG. 2, the memory cell 10 is a 6Tr-SRAM, that is, a static random access memory (SRAM) cell constituted by six transistors. Serially-connected p-type transistor P1 and n-type transistor N1 and serially-connected p-type transistor P2 and n-type transistor N2 are provided between VDD and VSS. The gates of the p-type transistor P1 and n-type transistor N1 are connected with the drains of the p-type transistor P2 and n-type transistor N2. The gates of the p-type transistor P2 and n-type transistor N2 are connected with the drains of the p-type transistor P1 and n-type transistor N1. An n-type transistor N3 that is to be a transfer gate is provided between the bit line BL and the drains of the p-type transistor P1 and n-type transistor N1. An n-type transistor N4 that is to be a transfer gate is provided between the bit line BLB and the drains of the p-type transistor P2 and n-type transistor N2. The word line WL is connected with the gates of the n-type transistors N3 and N4.

Referring back to FIG. 1, the semiconductor storage circuit 100 includes, as peripheral circuits, an I/O circuit 15, first and second row decoders 21 and 22, and a control circuit 30. The I/O circuit 15, which is a circuit of writing and reading data into and from the first and second memory cell arrays 11 and 12, is connected with the bit line pairs BL/BLB. The first row decoder 21 includes a plurality of word line drivers 20 corresponding to the rows of the first memory cell array 11, and drives the word lines WL0 to WL255. The second row decoder 22 includes a plurality of word line drivers 20 corresponding to the rows of the second memory cell array 12, and drives the word lines WL256 to WL511. The second row decoder 22 is placed side by side with the first row decoder 21 in the Y direction with space between them.

The control circuit 30 receives an address signal Address and a clock signal Clock from outside the semiconductor storage circuit 100. The control circuit 30 includes a row address decoder 31, which generates a decode address signal SAD of a plurality of bits (512 bits in the illustrated example) in response to the address signal Address. The bit signals of the decode address signal SAD are sent to the respective word line drivers 20 included in the first and second row decoders 21 and 22. Also, the control circuit 30 generates a clock signal SCK in response to the clock signal Clock. The clock signal SCK is sent to the word line drivers 20 included in the first and second row decoders 21 and 22. The clock signal SCK is an example of the control signal according to the present disclosure.

A relay buffer 40 is provided between the first row decoder 21 and the second row decoder 22, which buffers the clock signal SCK and outputs the buffered signal as a clock signal SCKa to be supplied to the second row decoder 22. While the word line drivers 20 of the first row decoder 21 directly receive the clock signal SCK output from the control circuit 30, the word line drivers 20 of the second row decoder 22 receive the clock signal SCKa via the relay buffer 40.

In this embodiment, the inter-array block 50 is constituted by tap cells and dummy memory cells. The tap cell is a cell that supplies a potential to the substrate or a well. The dummy memory cell is a cell that has a similar circuit structure to the memory cell 10 but does not operate as a memory cell. The relay buffer 40 and the inter-array block 50 are opposed to each other in the X direction and are the same in position and size in the Y direction.

Figure 3:
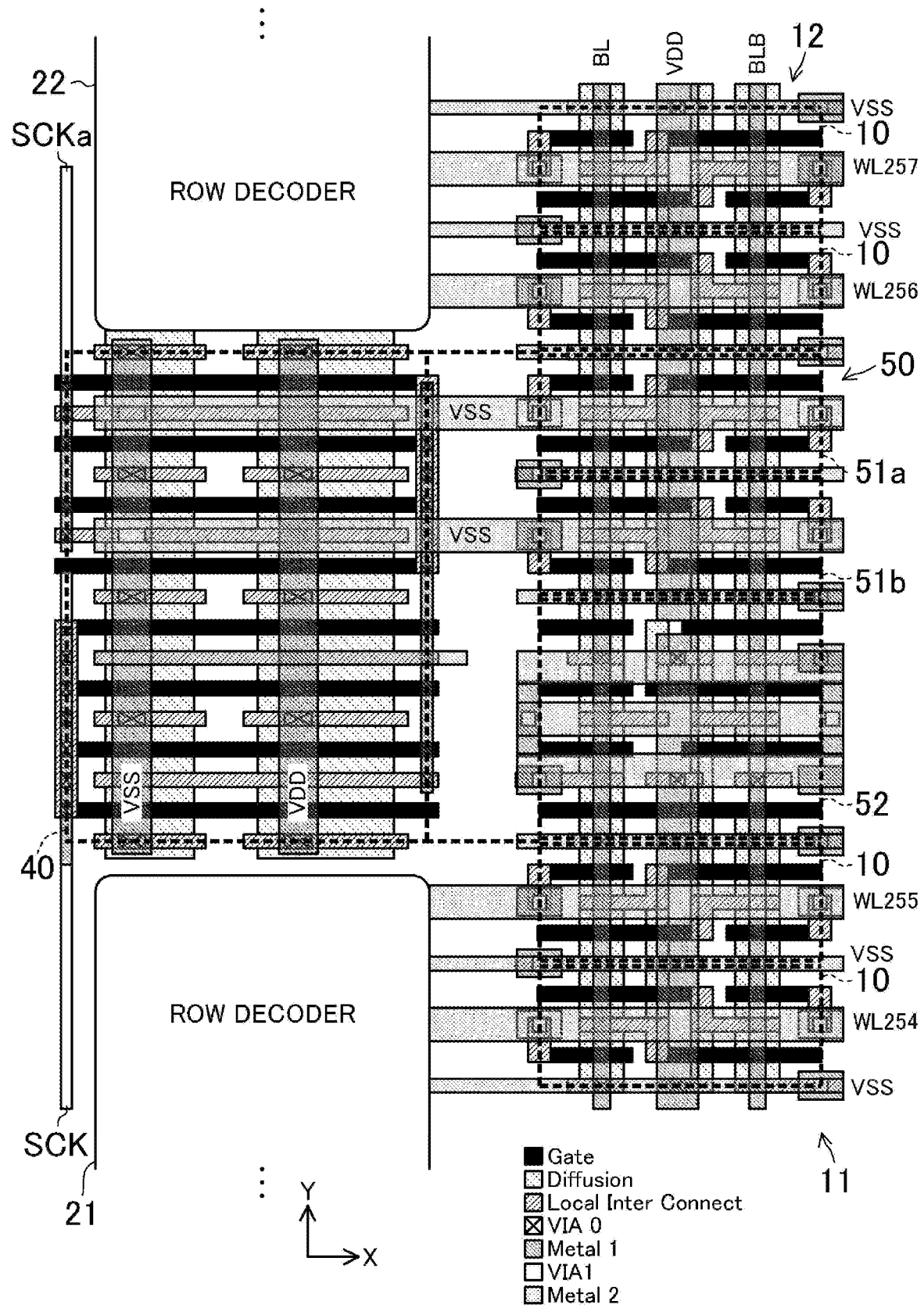
FIG. 3 is a detailed layout of part of the configuration of FIG. 1.
Figure 4:
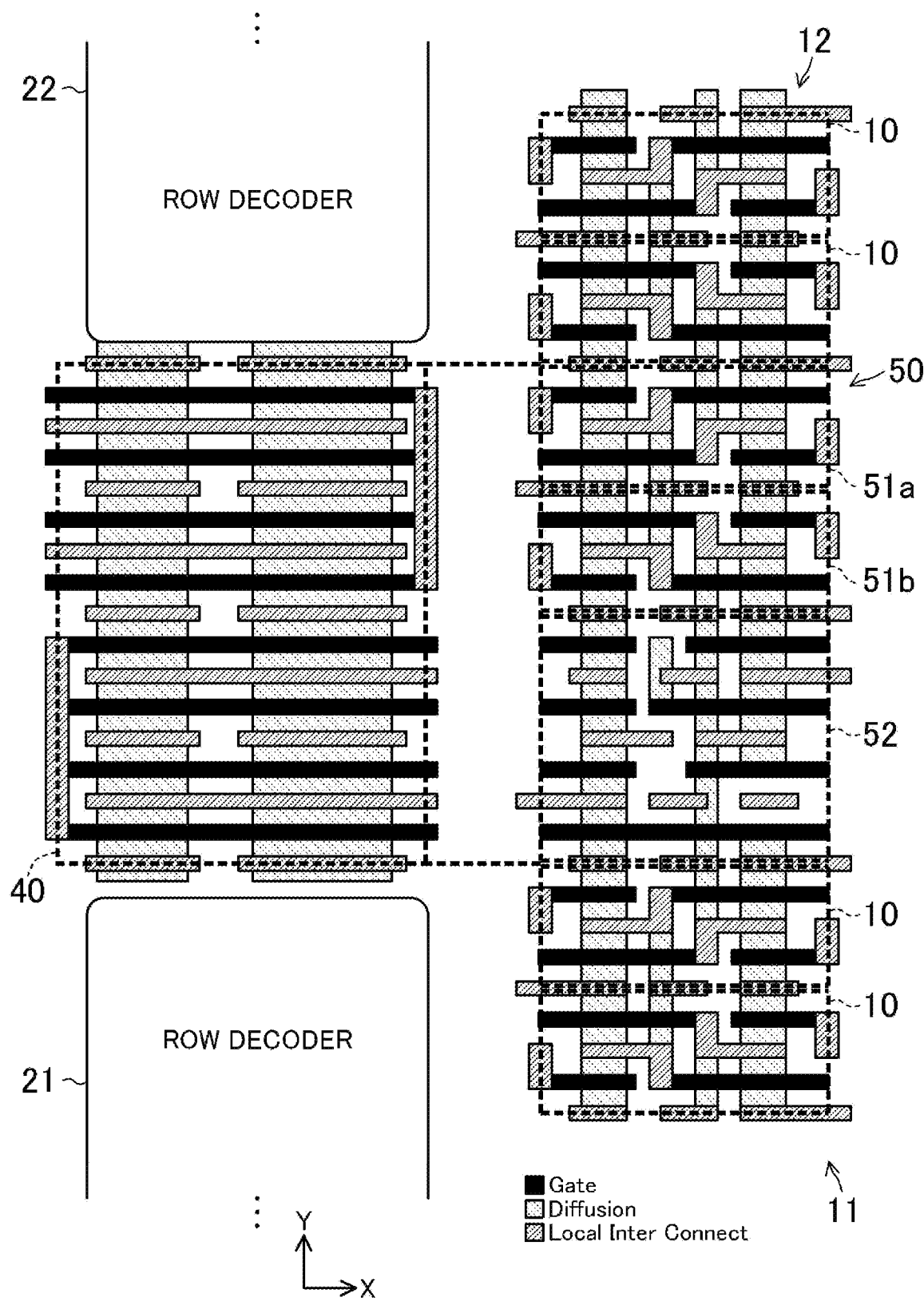
FIG. 4 is a detailed layout in which metal interconnects, etc. are omitted from FIG. 3.

FIG. 3 is a view showing an enlarged detailed layout of part of FIG. 1. In FIG. 3, shown is a boundary portion among the first memory cell array 11, the second memory cell array 12, the first row decoder 21, and the second row decoder 22. FIG. 4 is a view in which metal interconnect layers are omitted from FIG. 3. Note that illustration of the internal layouts of the first and second row decoders 21 and 22 is omitted in FIGS. 3 and 4. This also applies to the subsequent relevant drawings.

In FIGS. 3 and 4, word line signals WL254 and WL255 are supplied from the first row decoder 21 to two memory cells 10 included in the first memory cell array 11. Word line signals WL256 and WL257 are supplied from the second row decoder 22 to two memory cells 10 included in the second memory cell array 12.

FIG. 5 is an enlarged view of the layout of the memory cell 10. As shown in FIG. 5, the p-type transistors P1 and P2 and the n-type transistors N1, N2, N3, and N4 described in the circuit configuration of FIG. 2 are placed. The height of the memory cell 10 (the size in the Y direction) is twice the gate pitch.

The relay buffer 40 that buffers the clock signal SCK and outputs the buffered signal as the clock signal SCKa is provided between the first row decoder 21 and the second row decoder 22. The height of the relay buffer 40 is eight times as large as the gate pitch in the configuration of FIGS. 3 and 4.

Dummy memory cells 51a and 51b and a tap cell 52 are provided in the inter-array block 50 between the first memory cell array 11 and the second memory cell array 12.

Figure 6:
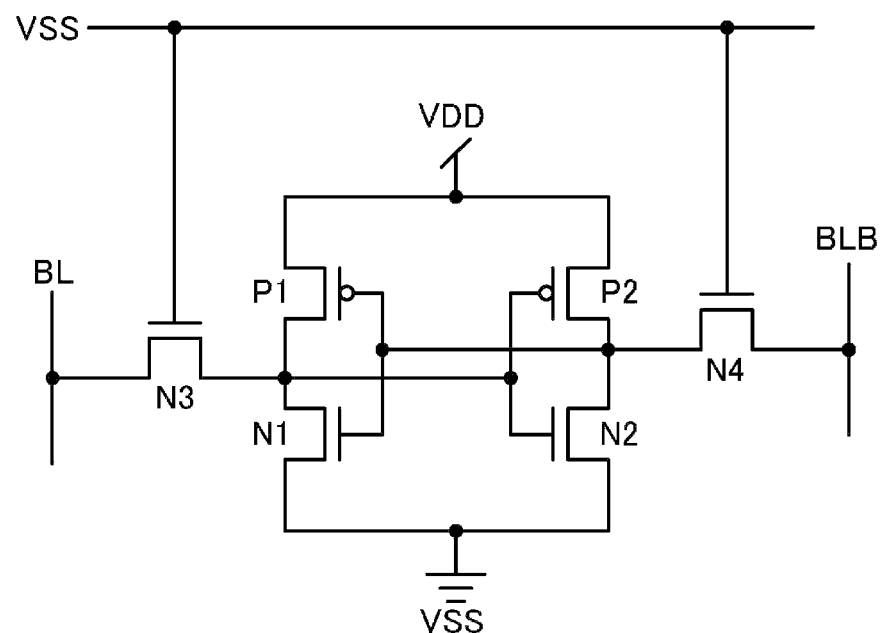
FIG. 6 is a circuit configuration diagram of a dummy memory cell.

FIG. 6 is a circuit configuration diagram of a dummy memory cell. The layout of the dummy memory cells 51a and 51b is similar to that of the memory cells 10 in FIG. 5, except that VSS is supplied to the word line WL in the dummy memory cells 51a and 51b. The height of the dummy memory cells 51a and 51b is the same as that of the memory cells 10, which is twice the gate pitch.

Figure 7:
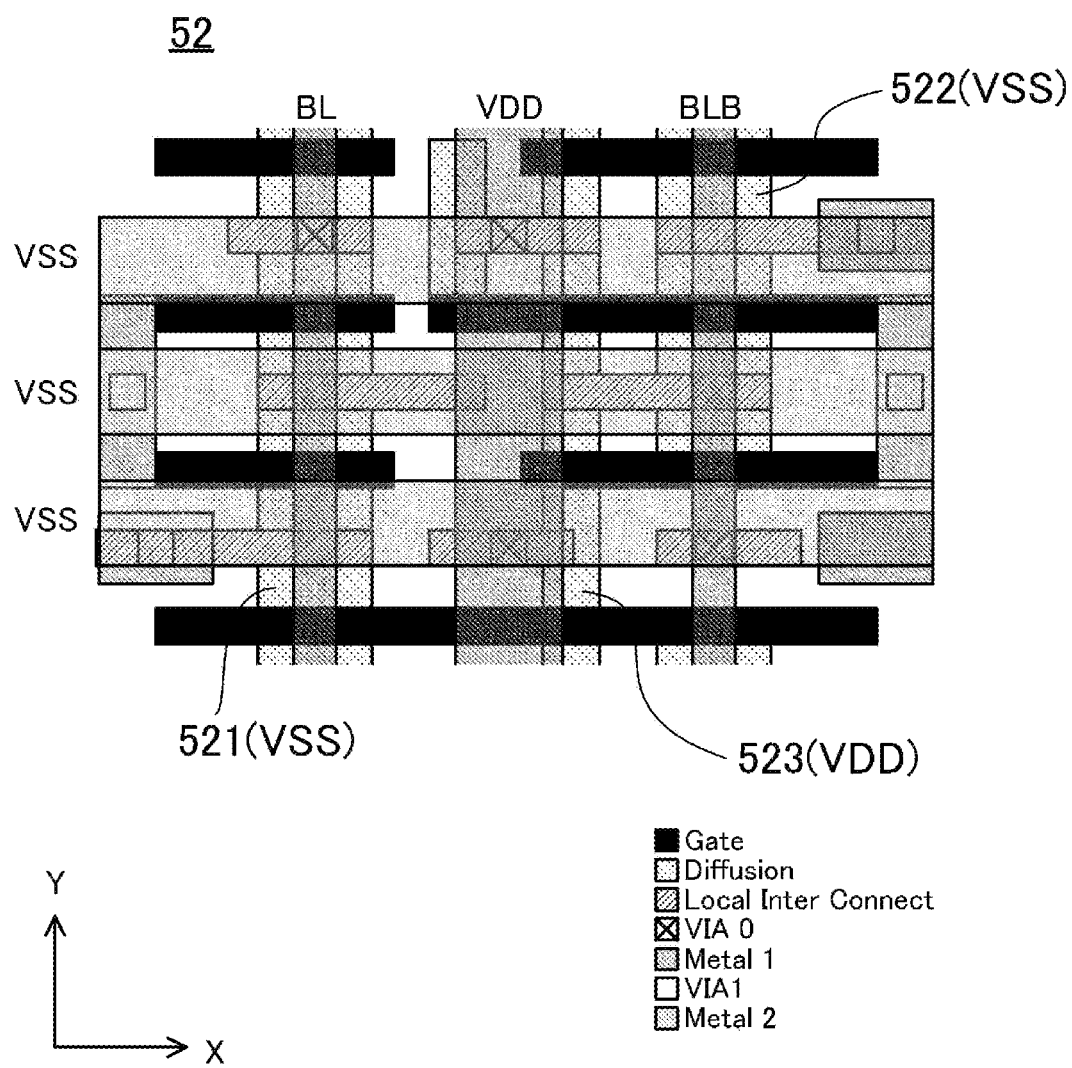
FIG. 7 is a layout of a tap cell.

FIG. 7 is an enlarged view of the layout of the tap cell 52. As shown in FIG. 7, the tap cell 52 supplies VSS supplied via metal interconnects (metal 2) extending in the X direction to diffusion regions 521 and 522. Also, the tap cell 52 supplies VDD supplied via metal interconnects (metal 1) extending in the Y direction to a diffusion region 523. VDD and VSS are then supplied to the substrate or the well via the diffusion regions 521, 522, and 523. The height of the tap cell 52 is four times as large as the gate pitch. Note that the tap cell 52 is not connected with the bit line BL or BLB.

In the configuration of FIGS. 3 and 4, the dummy memory cells 51a and 51b and the tap cell 52 are placed in a line in the Y direction in the inter-array block 50 that is opposed in the X direction to the relay buffer 40 having a height eight times as large as the gate pitch. Since the height of the dummy memory cells 51a and 51b each is twice as large as the gate pitch and the height of the tap cell 52 is four times as large as the gate pitch, the height of the inter-array block 50 is eight times as large as the gate pitch. That is, the relay buffer 40 and the inter-array block 50 are the same in position and size in the Y direction. To state this differently, the region between the first row decoder 21 and the second row decoder 22 is the same as the inter-array block 50 in position and size in the Y direction.

In addition, in the configuration of FIGS. 3 and 4, the first memory cell array 11, the inter-array block 50, and the second memory cell array 12 each have a plurality of gates extending in the X direction, and the gate pitch in the Y direction is uniform over the first memory cell array 11, the inter-array block 50, and the second memory cell array 12. Also, the bit lines BL and BLB extend in the Y direction over the first memory cell array 11, the inter-array block 50, and the second memory cell array 12.

In general, the proportion of the area of a semiconductor storage circuit such as an SRAM in a semiconductor integrated circuit is great. For this reason, memory cell arrays occupying most of a semiconductor storage circuit are designed to be as small as possible in area. Specifically, a design rule different from one for other circuit portions is used for memory cell arrays, to achieve reduction in area by this unique design rule.

Because of the difference in design rule, however, there arises a case where space must be provided as a buffer zone in a boundary region between a memory cell array and any other circuit portion. Moreover, a dummy pattern called an optical dummy must be placed around a memory cell array. The optical dummy has a shape imitating the layout of the memory cell array, but does not contribute to the operation of memory cells.

As a contrast example, a configuration is assumed in which, in order to provide the relay buffer 40 between the first row decoder 21 and the second row decoder 22, space is simply provided between the first memory cell array 11 and the second memory cell array 12. In this case, it is necessary to place an optical dummy on the boundary of the first memory cell array 11 closer to the second memory cell array 12 and an optical dummy on the boundary of the second memory cell array 12 closer to the first memory cell array 11, and further necessary to provide space as a buffer zone between the first memory cell array 11 and the second memory cell array 12. If the total size of these optical dummies and the space is greater than the size of the relay buffer 40, dead space will occur between the relay buffer 40 and the first and second row decoders 21 and 22. This will disadvantageously increase the layout area of the semiconductor storage circuit.

In contrast to the above, in this embodiment, the inter-array block 50 between the first memory cell array 11 and the second memory cell array 12 is constituted by the dummy memory cells 51a and 51b and the tap cell 52. Since the same design rule for the first and second memory cell arrays 11 and 12 is used for the dummy memory cells 51a and 51b and the tap cell 52, the first memory cell array 11, the inter-array block 50, and the second memory cell array 12 substantially constitute a single memory cell array as a whole. That is, unlike the contrast example described above, it is unnecessary to place an optical dummy or space as a buffer zone between the first memory cell array 11 and the second memory cell array 12. Therefore, occurrence of dead space around the relay buffer 40 can be prevented or reduced.

Also, in this embodiment, the number of dummy memory cells and tap cells to be placed in the inter-array block 50 can be adjusted in accordance with the size of the relay buffer 40. In the example of FIGS. 3 and 4, two dummy memory cells having a height twice as large as the gate pitch and one tap cell having a height four times as large as the gate pitch are placed in the inter-array block 50, to match the size in the Y direction with the relay buffer 40 having a height eight times as large as the gate pitch. As other examples, when the relay buffer 40 has a height four times as large as the gate pitch, two dummy memory cells having a height twice as large as the gate pitch or one tap cell having a height four times as large as the gate pitch, for example, may be placed in the inter-array block 50. When the relay buffer 40 has a height 16 times as large as the gate pitch, four dummy memory cells having a height twice as large as the gate pitch, two tap cells having a height four times as large as the gate pitch, for example, may be placed in the inter-array block 50. Thus, even when the load capacitance to be driven by the relay buffer 40 changes and it is desired to change the size of the relay buffer 40, flexible response to such a size change is possible.

As described above, in this embodiment, the relay buffer 40 that buffers the clock signal SCK and outputs the clock signal SCKa to be supplied to the second row decoder 22 is provided between the first row decoder 21 and the second row decoder 22. With this relay buffer 40, interconnect delay related to the clock signal SCKa supplied to the second row decoder 22 is prevented or reduced. Also, the inter-array block 50 lying between the first memory cell array 11 and the second memory cell array 12 is constituted by the tap cell 52 and the dummy memory cells 51a and 51b. The relay buffer 40 and the inter-array block 50 are the same in position and size in the Y direction. In other words, the region between the first row decoder 21 and the second row decoder 22 is the same as the inter-array block 50 in position and size in the Y direction. Therefore, no wasted dead space occurs between the relay buffer 40 and the first and second row decoders 21 and 22. Thus, in the semiconductor storage circuit 100, it is possible to prevent or reduce an increase in area while preventing or reducing degradation in performance due to an increase in interconnect delay caused by interconnect resistance.

(Alteration)

Figure 8:
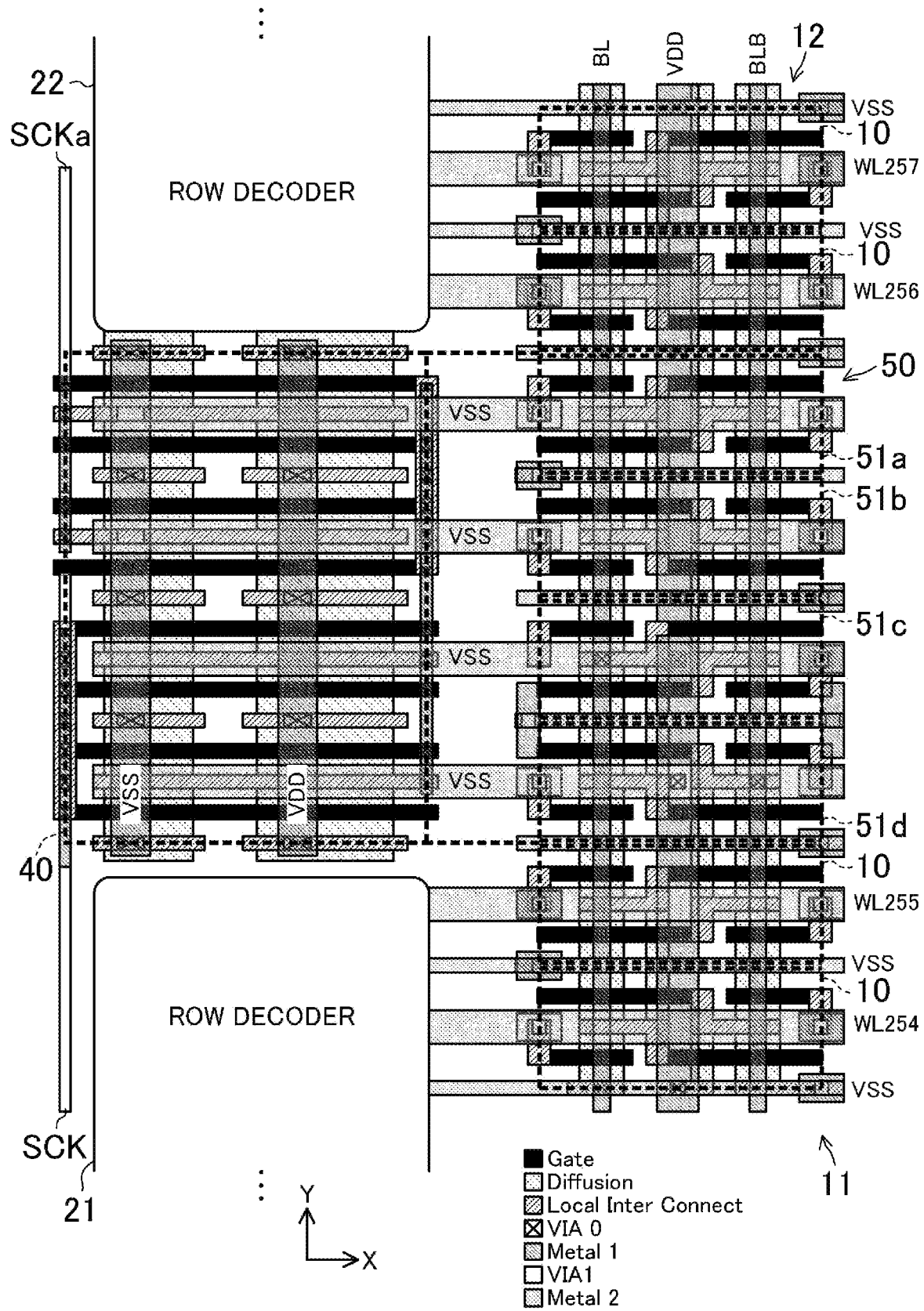
FIG. 8 is a detailed layout of part of the configuration of FIG. 1 in an alteration.
Figure 9:
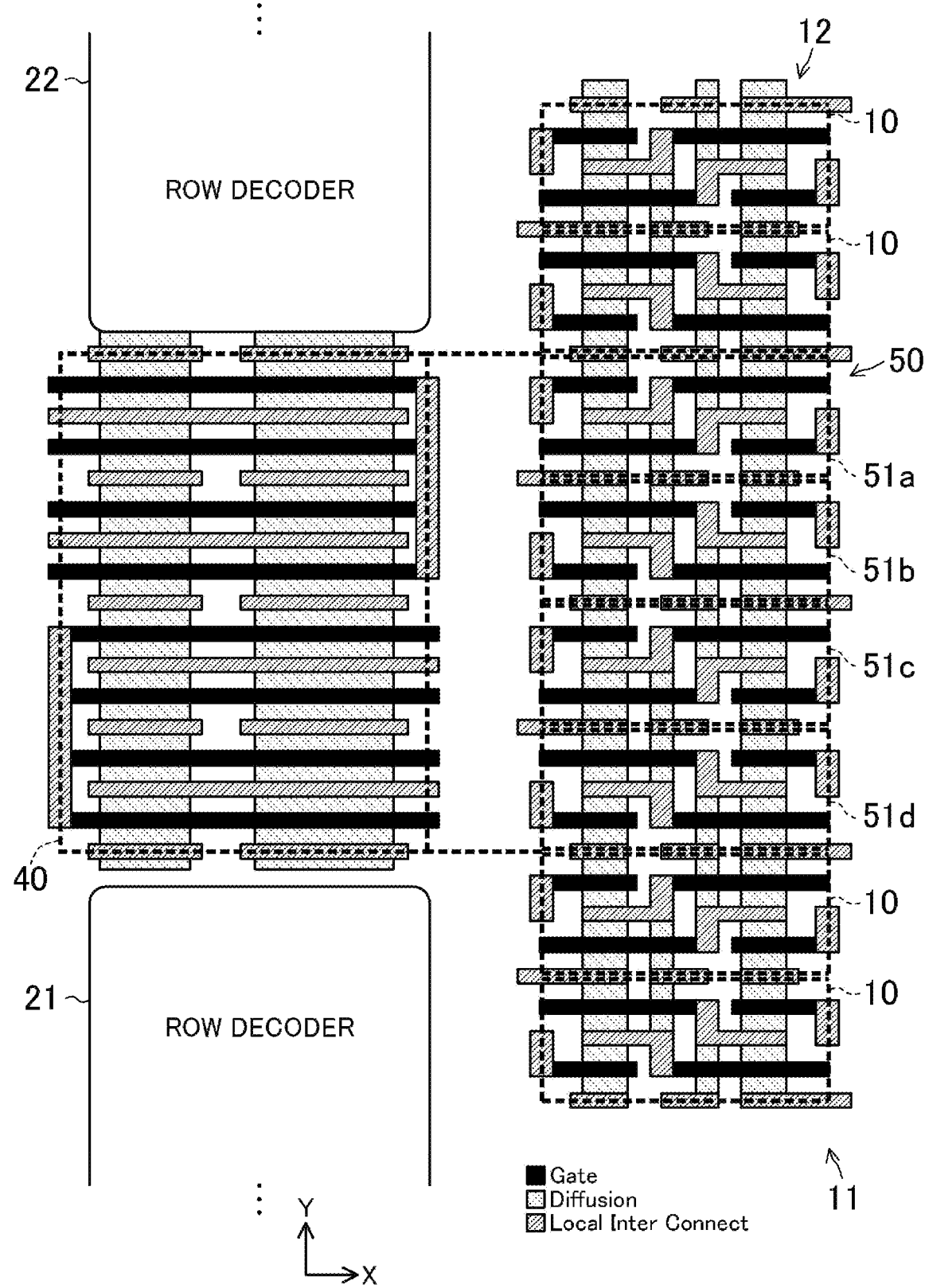
FIG. 9 is a detailed layout in which metal interconnects, etc. are omitted from FIG. 8.

FIG. 8 is a view showing a detailed layout of an alteration. FIG. 9 is a view in which metal interconnect layers are omitted from FIG. 8. FIGS. 8 and 9 show the same part as the detailed layout of FIGS. 3 and 4, in which common components are denoted by the same reference characters.

In FIGS. 8 and 9, the inter-array block 50 between the first memory cell array 11 and the second memory cell array 12 is constituted by only dummy memory cells. That is, dummy memory cells 51a, 51b, 51c, and 51d are provided in the inter-array block 50.

In the configuration of FIGS. 8 and 9, the dummy memory cells 51a, 51b, 51c, and 51d are placed in a line in the Y direction in the inter-array block 50, which is opposed in the X direction to the relay buffer 40 having a height eight times as large as the gate pitch. Since the height of the dummy memory cells 51a, 51b, 51c, and 51d each is twice as large as the gate pitch, the height of the inter-array block 50 is eight times as large as the gate pitch. That is, the relay buffer 40 and the inter-array block 50 are the same in position and size in the Y direction. To state this differently, the region between the first row decoder 21 and the second row decoder 22 is the same as the inter-array block 50 in position and size in the Y direction. Thus, in this alteration, also, similar effects to those in the above embodiment can be obtained.

(Other Configurations)

Figure 10:
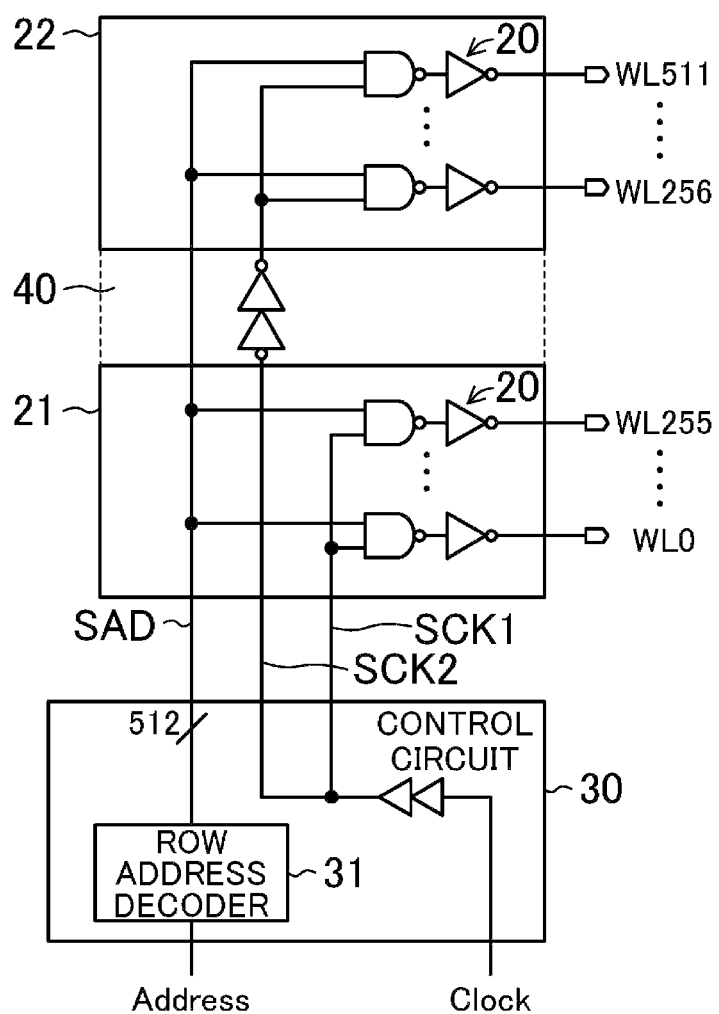
FIG. 10 shows another configuration example related to supply of a clock signal.

In the above embodiment, the relay buffer 40 buffers the clock signal SCK after the signal is supplied to the first row decoder 21 and supplies the buffered signal to the second row decoder 22. Alternatively, as shown in FIG. 10, the control circuit 30 may generate a clock signal SCK2 separately from a clock signal SCK1 to be supplied to the first row decoder 21. The relay buffer 40 may directly receive the clock signal SCK2 from the control circuit 30, buffer the signal, and supply the buffered signal to the second row decoder 22. This can speed up the transmission of the clock signals SCK1 and SCK2 to the word line drivers 20.

In the above embodiment, the bit line pairs BL/BLB are placed to extend through the first memory cell array 11, the inter-array block 50, and the second memory cell array 12 continuously. Alternatively, no bit line pairs may be placed in the inter-array block 50, so that the bit line pairs connected in the first memory cell array 11 may not be directly connected with the bit line pairs connected in the second memory cell array 12. In this case, since no load capacitance by the dummy memory cells in the inter-array block 50 is added to any bit line pairs, the operation of the semiconductor storage circuit will become more stable.

The inter-array block 50 is constituted by the dummy memory cells and the tap cell in the above embodiment, and is constituted by only the dummy memory cells in the alteration. Alternatively, the inter-array block 50 may be constituted by only a tap cell.

In the above embodiment, the semiconductor storage circuit 100 has two memory cell arrays 11 and 12, and the number of rows of the memory cell arrays 11 and 12 each is 256, totally 512 rows in the entire semiconductor storage circuit 100. The number of memory cell arrays in the semiconductor storage circuit and the sizes of each memory cell array and the semiconductor storage circuit are not limited to those described in the above embodiment. For example, the semiconductor storage circuit may have three memory cell arrays lining up in the Y direction, and two inter-array blocks between the memory cell arrays may have a configuration as the one in the above embodiment.

In the above embodiment, the memory cell is a one-port 6Tr memory cell as shown in FIG. 2. The configuration of the memory cell is not limited to this, but may be a two-port memory cell, for example.

What is claimed is:

1. A semiconductor storage circuit, comprising:
a first memory cell array having a plurality of memory cells arranged in X and Y directions;
a second memory cell array having a plurality of memory cells arranged in the X and Y directions and lying side by side with the first memory cell array in the Y direction with space between them;
a first row decoder including a plurality of word line drivers corresponding to rows of the first memory cell array;
a second row decoder including a plurality of word line drivers corresponding to rows of the second memory cell array and lying side by side with the first row decoder in the Y direction with space between them;
a control circuit configured to generate a control signal to be supplied to the first and second row decoders:
a relay buffer, provided between the first row decoder and the second row decoder, configured to buffer the control signal to be supplied to the second row decoder; and
an inter-array block provided between the first memory cell array and the second memory cell array and constituted by at least either a tap cell or a dummy memory cell, wherein
the relay buffer and the inter-array block are the same in position and size in the Y direction.

2. The semiconductor storage circuit of claim 1, wherein the inter-array block is constituted by only a dummy memory cell.

3. The semiconductor storage circuit of claim 1, wherein the first memory cell array, the inter-array block, and the second memory cell array each include a plurality of gates extending in the X direction, and
a gate pitch in the Y direction is uniform in the first memory cell array, the inter-array block, and the second memory cell array.

4. The semiconductor storage circuit of claim 1, wherein the dummy memory cell constituting the inter-array block has the same layout as the memory cells of the first and second memory cell arrays.

5. The semiconductor storage circuit of claim 1, comprising:
bit lines extending in the Y direction over the first memory cell array, the inter-array block, and the second memory cell array.

6. A semiconductor storage circuit, comprising:
a first memory cell array having a plurality of memory cells arranged in X and Y directions;
a second memory cell array having a plurality of memory cells arranged in the X and Y directions and lying side by side with the first memory cell array in the Y direction with space between them;
a first row decoder including a plurality of word line drivers corresponding to rows of the first memory cell array;
a second row decoder including a plurality of word line drivers corresponding to rows of the second memory cell array and lying side by side with the first row decoder in the Y direction with space between them;
a control circuit configured to generate a control signal to be supplied to the first and second row decoders:
a relay buffer, provided between the first row decoder and the second row decoder, configured to buffer the control signal to be supplied to the second row decoder; and an inter-array block provided between the first memory cell array and the second memory cell array and constituted by at least either a tap cell or a dummy memory cell, wherein a region between the first row decoder and the second row decoder is the same as the inter-array block in position and size in the Y direction.

7. The semiconductor storage circuit of claim 6, wherein the inter-array block is constituted by only a dummy memory cell.

8. The semiconductor storage circuit of claim 6, wherein the first memory cell array, the inter-array block, and the second memory cell array each include a plurality of gates extending in the X direction, and a gate pitch in the Y direction is uniform in the first memory cell array, the inter-array block, and the second memory cell array.

9. The semiconductor storage circuit of claim 6, wherein the dummy memory cell constituting the inter-array block has the same layout as the memory cells of the first and second memory cell arrays.

10. The semiconductor storage circuit of claim 6, comprising:

bit lines extending in the Y direction over the first memory cell array, the inter-array block, and the second memory cell array.

\* \* \* \* \*